US007579886B2

(12) United States Patent
Hufford et al.

(10) Patent No.: US 7,579,886 B2
(45) Date of Patent: Aug. 25, 2009

(54) PHASE LOCKED LOOP WITH ADAPTIVE PHASE ERROR COMPENSATION

(75) Inventors: Michael M. Hufford, Catonsville, MD (US); Eric Naviasky, Ellicott, MD (US); Tony Caviglia, Marriottsville, MD (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 11/608,213

(22) Filed: Dec. 7, 2006

(65) Prior Publication Data
US 2008/0136532 A1 Jun. 12, 2008

(51) Int. Cl.
*H03L 7/06* (2006.01)
(52) U.S. Cl. ............................. 327/156; 327/147
(58) Field of Classification Search ............ 327/147, 327/156
See application file for complete search history.

(56) References Cited

U.S. PATENT DOCUMENTS

| 5,038,120 | A | 8/1991 | Wheatley et al. |
| 5,334,952 | A * | 8/1994 | Maddy et al. ............ 331/1 A |
| 6,603,360 | B2 | 8/2003 | Kim et al. |
| 6,661,294 | B2 * | 12/2003 | Terashima et al. ........... 331/17 |
| 7,091,760 | B1 | 8/2006 | Chang et al. |
| 7,098,754 | B2 | 8/2006 | Humphreys et al. |
| 7,339,861 | B2 * | 3/2008 | Minamino et al. ....... 369/47.28 |
| 2003/0062957 | A1 * | 4/2003 | Terashima et al. ............ 331/17 |
| 2004/0207475 | A1 * | 10/2004 | Minamino et al. ............ 331/16 |

FOREIGN PATENT DOCUMENTS

JP 06-276089 * 9/1994

OTHER PUBLICATIONS

Brennan, Paul V., "Phase-Locked Loops/Principles and Practice", Chapter 8 - 'Digital Loop Techniques and Design Methods'; McGraw-Hill, 1996, pp. 119-127.
Best, Roland E., "Phase-Locked Loops/Design, Simulation, and Applications", Chapter 3 - 'The Classical Digital PLL (DPLL)'; McGraw-Hill, 1997, pp. 139-140 and 145-147.
Barrett, Curtis (Editor), Texas Instruments Technical Brief SWRA029 "Fractional/Integer-N PLL Basics", Wireless Communication Business Unit; Aug. 1999, pp. 1-55.

* cited by examiner

*Primary Examiner*—Lincoln Donovan
*Assistant Examiner*—Ryan C Jager
(74) *Attorney, Agent, or Firm*—Duane Morris LLP; Stephen C. Durant

(57) ABSTRACT

An adaptive phase-locked loop (PLL) circuit produces an output signal having a frequency in reference to the frequency of a reference signal. The PLL circuit includes an oscillator configured to generate the output signal according to a frequency control signal, and a processing circuit configured to generate a feedback signal deriving from the output signal. An adjustable shift circuit is provided to time-shift the feedback signal. The PLL further includes a phase comparison circuit configured to generate a phase error signal indicating a phase error between the time-shifted feedback signal and the reference signal, and a control circuit configured to generate the frequency control signal based on the phase error signal. The adjustable shift circuit adjusts a time-shift amount to time-shift the feedback signal according to the phase error signal.

9 Claims, 16 Drawing Sheets

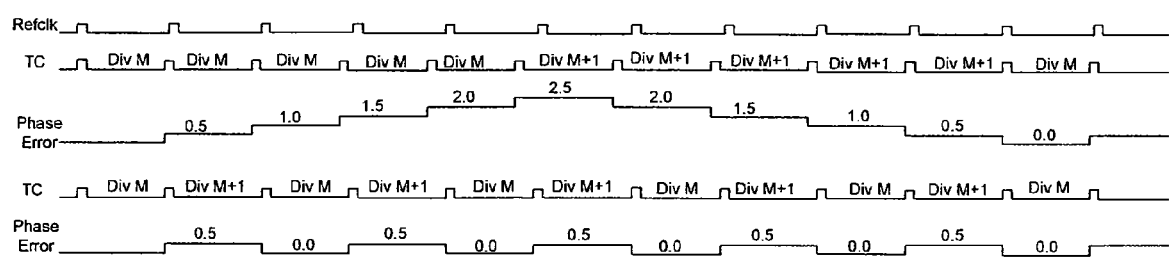
Figure 7 Comparison of phase errors between two modulus patterns for div by M.5. Phase error is normallized to 2pi

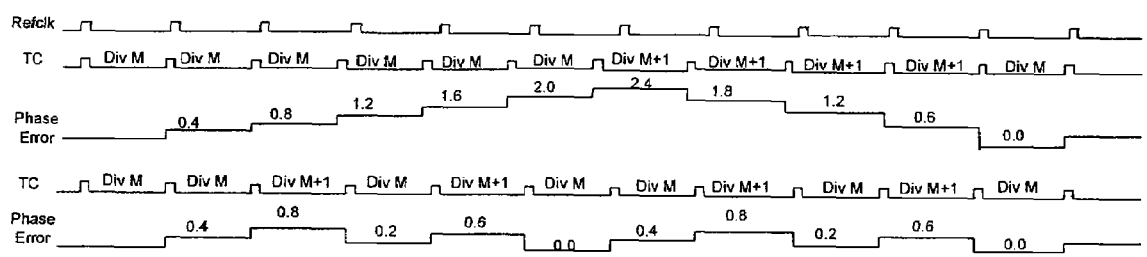
FIGURE 9 Comparison of phase errors between two modulus patterns for Div M.4

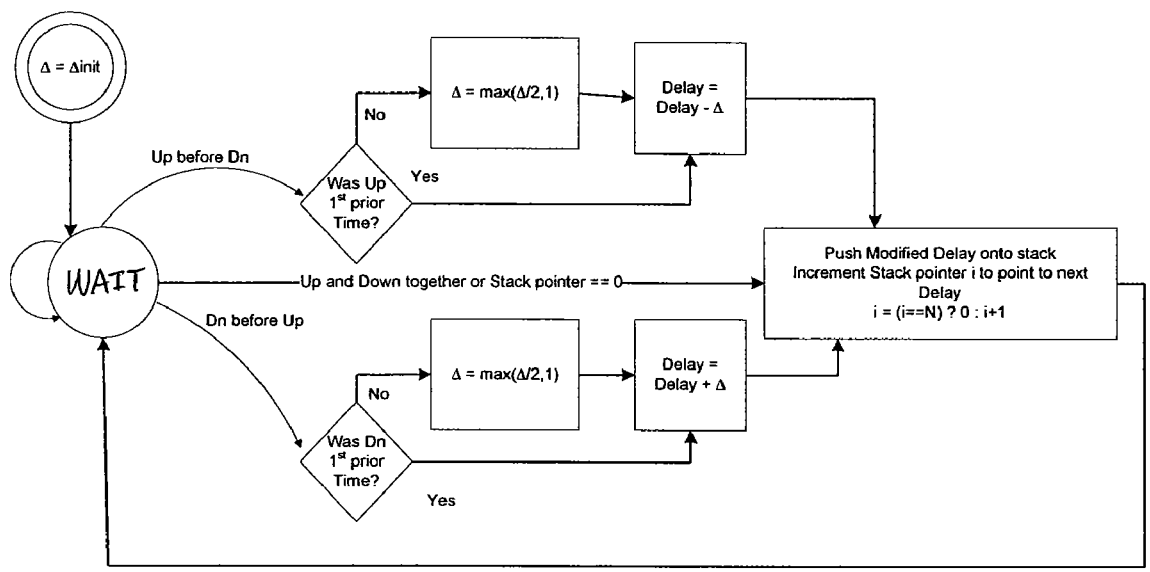
FIGURE 11 Flow diagram for Successive Approximation delay settling

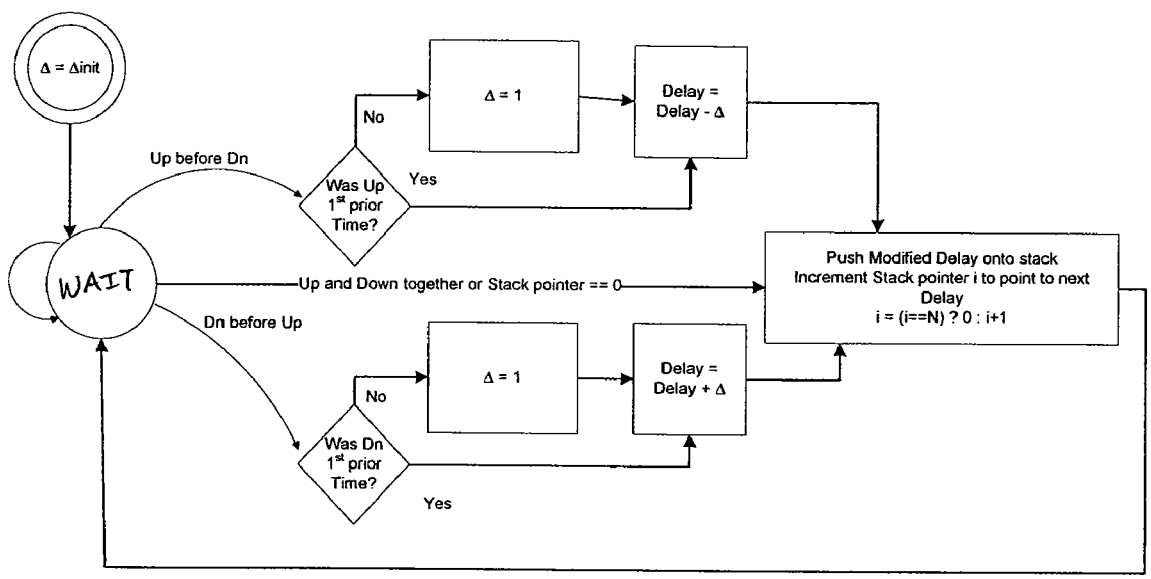
FIGURE 12 Flow diagram for Large step to small step delay settling

US 7,579,886 B2

PHASE LOCKED LOOP WITH ADAPTIVE PHASE ERROR COMPENSATION

FIELD OF THE DISCLOSURE

The present invention relates to a phase locked loop (PLL), and more particularly, to a phase locked loop circuit with adaptive phase error compensation

BACKGROUND OF THE INVENTION

A frequency synthesizer is an apparatus that generates an output signal having a frequency that is an exact multiple of a reference frequency. The accuracy of the output signal frequency is typically determined by the accuracy and stability of the reference frequency source.

A common type of frequency synthesizer uses a phase-locked loop (PLL) to provide an output signal having a selectable, precise and stable frequency. The PLL includes a phase detector, a voltage-controlled oscillator (VCO) and a feedback path arranged in a way that the phase of the VCO output is forced to be synchronous with the phase of the input reference frequency. FIG. 1 is a circuit diagram showing a configuration of a conventional integer-N phase locked loop (PLL) circuit having an integer frequency divider.

Referring to FIG. 1, a frequency divider 10 generates a reference clock signal Refclk by dividing the frequency of a reference signal Fosc by N. A phase-frequency comparator (PFD) 11 receives the reference clock signal Refclk and a feedback signal Fbclk, which is obtained by dividing an output signal Fvco of a voltage controlled oscillator (VCO) 14 by a frequency divider 15. The phase-frequency comparator 11 detects a phase error between the reference clock signal Refclk and the feedback signal Fbclk, and outputs pulse signals UP and DN corresponding to the phase error. A charge pump 12 generates a charge pump output current in response to the pulse signals UP and DN. The charge pump output current flows to a loop filter 13. The loop filter 13 removes a high frequency constituent of the charge pump output current, and outputs a control signal in proportion to the inputted current. The VCO 14 generates the output signal Fvco in proportion to the control signal of the loop filter 13. The output signal Fvco is divided by M, or, multiplied by 1/M, by the frequency divider 15, and is fed back to the phase-frequency comparator 11 as the feedback signal Fbclk. Accordingly, the output signal Fvco can be described as follows:

$Fvco=Refclk*M=Fosc*(M/N)$

Therefore, the integer-N PLL circuit can obtain the output signal Fvco having a frequency that is M/N times higher than that of the reference signal Fosc. By using a divider circuit in the VCO feedback path and controlling the division ratio, a variable frequency can be provided at the output of the frequency synthesizer. In this manner, the VCO output frequency is an exact multiple of the reference frequency. In other words, Fvco tracks the frequency of the reference signal Fosc.

However, in an integer-N PLL, the requirement of frequency resolution normally obtained by the pre-divider become incompatible with jitter requirements which dictate loop bandwidth necessary to suppress VCO noise. The finer the frequency resolution or channel spacing directs the loop bandwidth to be very low, whereas the lower jitter requirements dictate the loop bandwidth to be relatively high.

Fractional-N PLL's are employed trying to address the drawbacks of integer-N PLL. There are three basic approaches to implementing a fractional-N PLL. At the heart of all the approaches is a multi-modulus feedback counter that is directed to implement a time-averaged fractional division of the output frequency when compared to the reference frequency. FIG. 2 shows a classical fractional-N approach. A fixed pattern of divide by M and M+1 is used to effect the time averaged fractional division. For instance, in order to generate an output frequency that is 200.1 times the reference frequency, a M/M+1 divider 25 is provided in the feedback look to divide the output signal Fvco by 200 for 9 reference cycles and by 201 for one reference cycle. This gives a time-average of (9*200+201)/10=200.1 times the reference frequency. Under normal operation using a fractional pattern, a phase error will accumulate while the feedback counter 25 divides the output signal Fvco by M, and the phase error is reduced or removed when the counter 25 divides the output signal Fvco by M+1. FIG. 3 shows changes of phase errors during different dividing processes. However, the operation of fractional-N PLL usually causes in-band frequency spurs as shown in FIG. 4, which manifests itself in output jitter and is undesirable. To suppress spurs in the classical fractional-N PLLs, the only recourse is to reduce the loop bandwidth, which would result in more VCO noise.

Other modified types of fractional-N PLL also were proposed to improve the performance of PLLs, such as PLLs using DAC compensation to minimize phase errors introduced by the classical fractional-N, or fractional-N PLL using delta-sigma approach, wherein the loop filter has a sharper transition band to reject the out of band noise introduced by the modulator used in conventional fractional-N PLLs.

For the DAC compensation approach, although the spurs can be lowered, it is a purely open-loop method and relies on accuracy of the compensation. Consequently, the spurs can only be reduced to a finite level of maybe −20 dBc. The delta-sigma approach, though can remove fractional-spurs, needs to deal with different problems arising from the unique design of the delta-sigma approach. For instance, in delta-sigma modulators, idle tones are introduced as in-band spurs at very low frequencies. These tones can be removed by adding dither, which, however, would add design complexity to an already complex system. Although higher order modulators can be used to reduce the idle tone generation by increasing the chaotic energy which busts up the tonal energy, higher order modulators require steeper transition loop filters which in turn affect phase margin and stability. MASH delta-sigma architectures have been introduced to remove the problem of instability. However, the MASH delta-sigma approach suffers from similar tonal problems. Dithering may be employed to suppress the tonal generation but this introduces more complexity into an already complex system.

Therefore, there is a need for a PLL that can effectively reduce the phase errors introduced by the operation of the PLL. Additionally, there is another need for a PLL design with minimal complexity and efficient phase-error reductions.

SUMMARY OF THE DISCLOSURE

This disclosure describes various embodiments for new PLL designs that address one or more of the above-described needs. The present disclosure also describes novel PLL designs that allow very accurate fractional divisions and do not suffer from the accuracy limitations of conventional DAC compensation and do not inject other tonal anomalies such as those of the delta-sigma approach.

According to an embodiment, an exemplary adaptive phase-locked loop (PLL) circuit provides an output signal having a frequency in reference to the frequency of a reference signal. The PLL circuit includes an oscillator, such as a voltage-controlled oscillator, configured to generate the output signal according to a frequency control signal, a processing circuit configured to generate a feedback signal deriving from the output signal, and an adjustable shift circuit configured to time-shift the feedback signal. The processing circuit may include a frequency divider, such as a M or M/M+1 divider. A phase comparison circuit, such as a phase frequency detector, is provided to generate a phase error signal indicating a phase error between the time-shifted feedback signal and the reference signal. The PLL further includes a control circuit configured to generate the frequency control signal based on the phase error signal. The control circuit may be the combination of a charge pump and a loop filter. The adjustable shift circuit adjusts a time-shift amount to time-shift the feedback signal according to the phase error signal.

In one aspect, the processing circuit is a frequency divider, such as a M divider or M/M+1 divider. In another aspect, the adjustable shift circuit is configured to delay or advance the feedback signal. The time-shift amount may be determined based on a condition of the phase error occurring in a previous cycle, such as an arrival sequence of the Up and Dn signals generated by a PFD.

The exemplary PLL circuit may further include a mismatch compensation circuit configured to modify the phase error signal by time-shifting the phase error signal to compensate for a mismatch condition occurring in the PLL circuit, and to provide the modified phase error signal to the adjustable shift circuit for adjusting the time-shift amount to time-shift the feedback signal. In one embodiment, the mismatch compensation circuit and the adjustable shift circuit do not perform time-shifting functions at the same time. The phase error may include an up signal and a down signal, and at least one of the up signal and the down signal is time-shifted according to an arrival sequence of the up signal and the down signal.

Additional aspects and advantages of the present disclosure will become readily apparent to those skilled in this art from the following detailed description, wherein only exemplary embodiments of the present disclosure are shown and described, simply by way of illustration of the best mode contemplated for carrying out the present disclosure. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawings and in which like reference numerals refer to similar elements, where.

DETAILED DESCRIPTION OF THE DISCLOSURE

In the following description, for the purposes of explanation, numerous specific details are set forth in order to provide a thorough understanding of the present disclosure. It will be apparent, however, to one skilled in the art that the present disclosure may be practiced without these specific details. In other instances, well-known structures and devices are shown in block diagram form in order to avoid unnecessarily obscuring the present disclosure.

Figure 1:
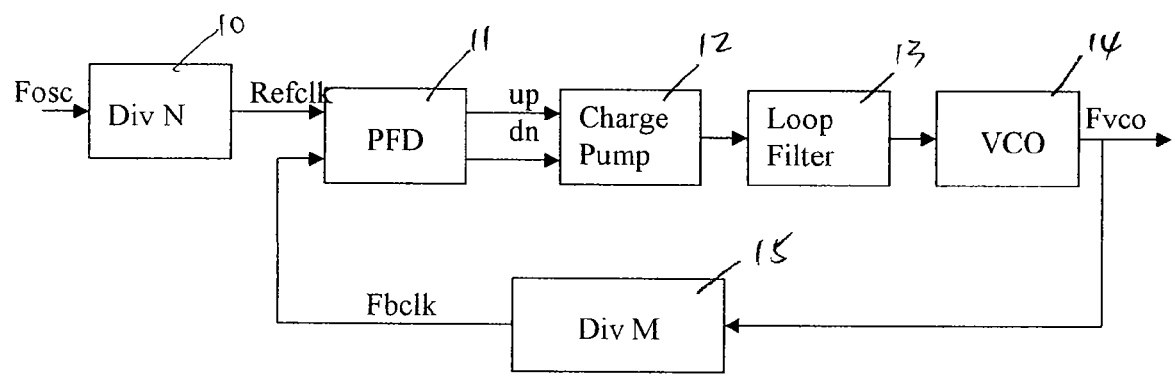
FIG. 1 is a block diagram of a conventional integer-N PLL.
Figure 2:
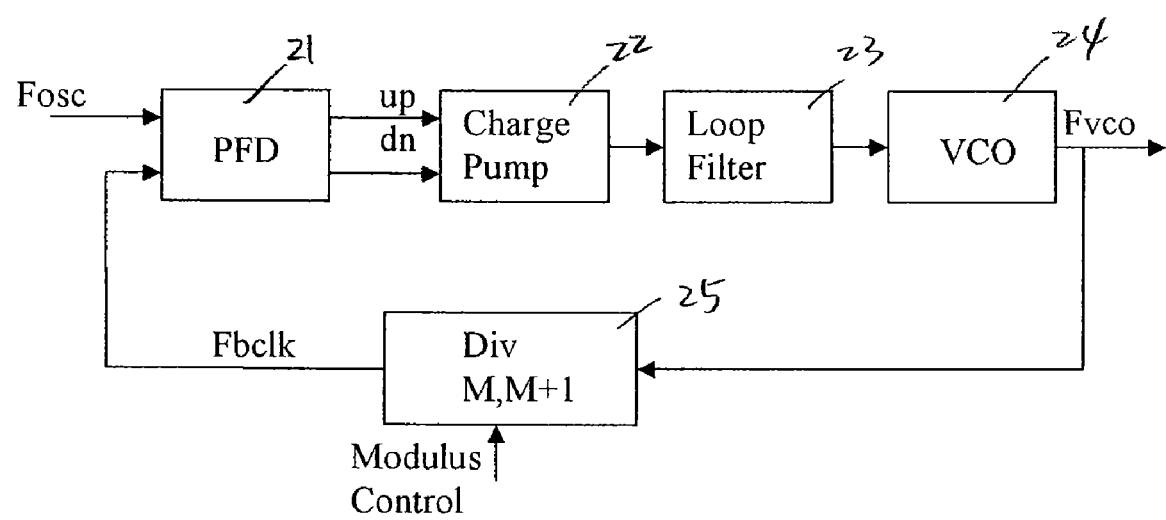
FIG. 2 is a block diagram of a conventional fractional-N PLL.
Figure 3:
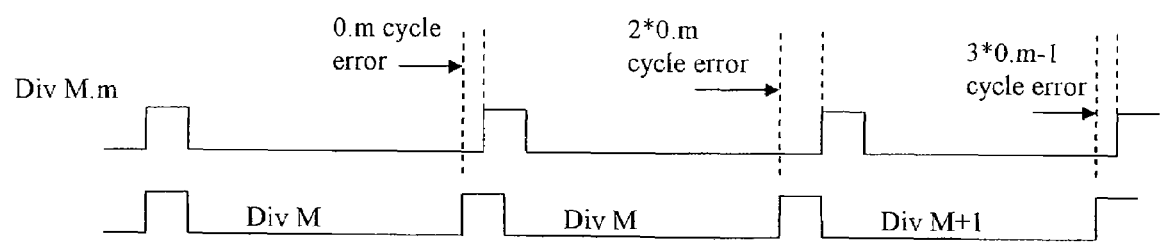
FIGS. 3 and 4 illustrate unwanted spurs occurring in conventional fractional-N PLL.
Figure 4:
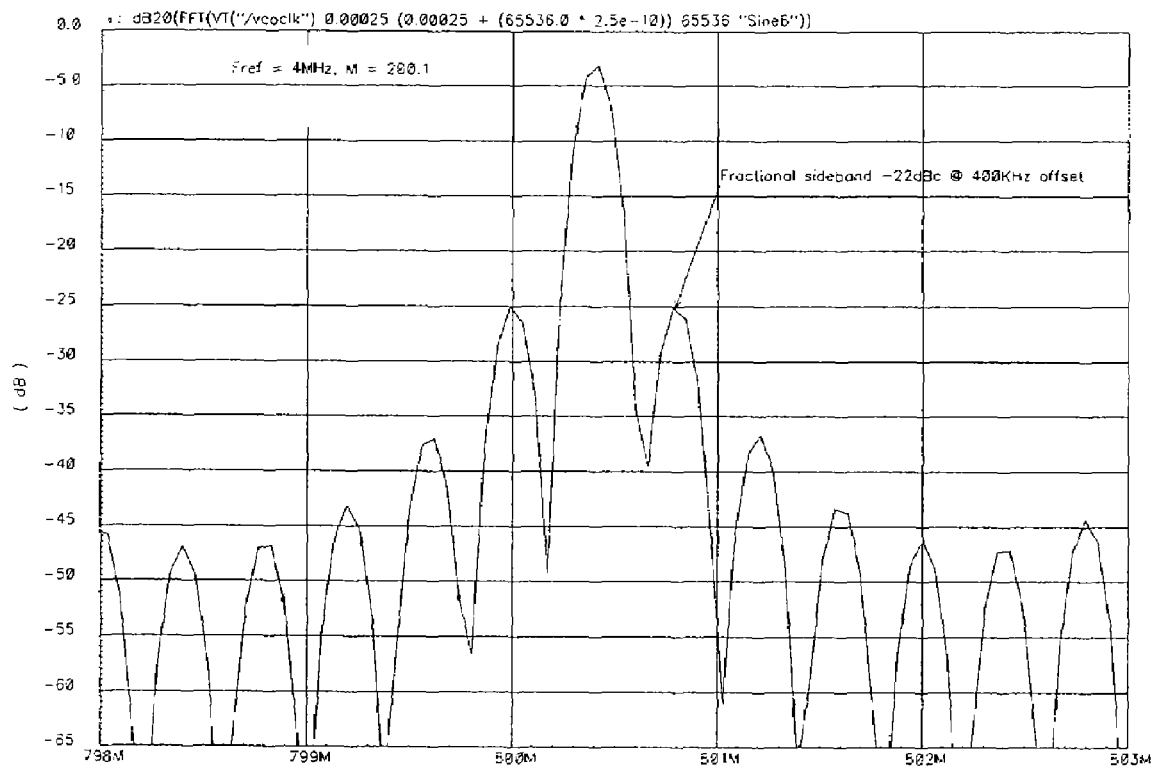
Figure 5:
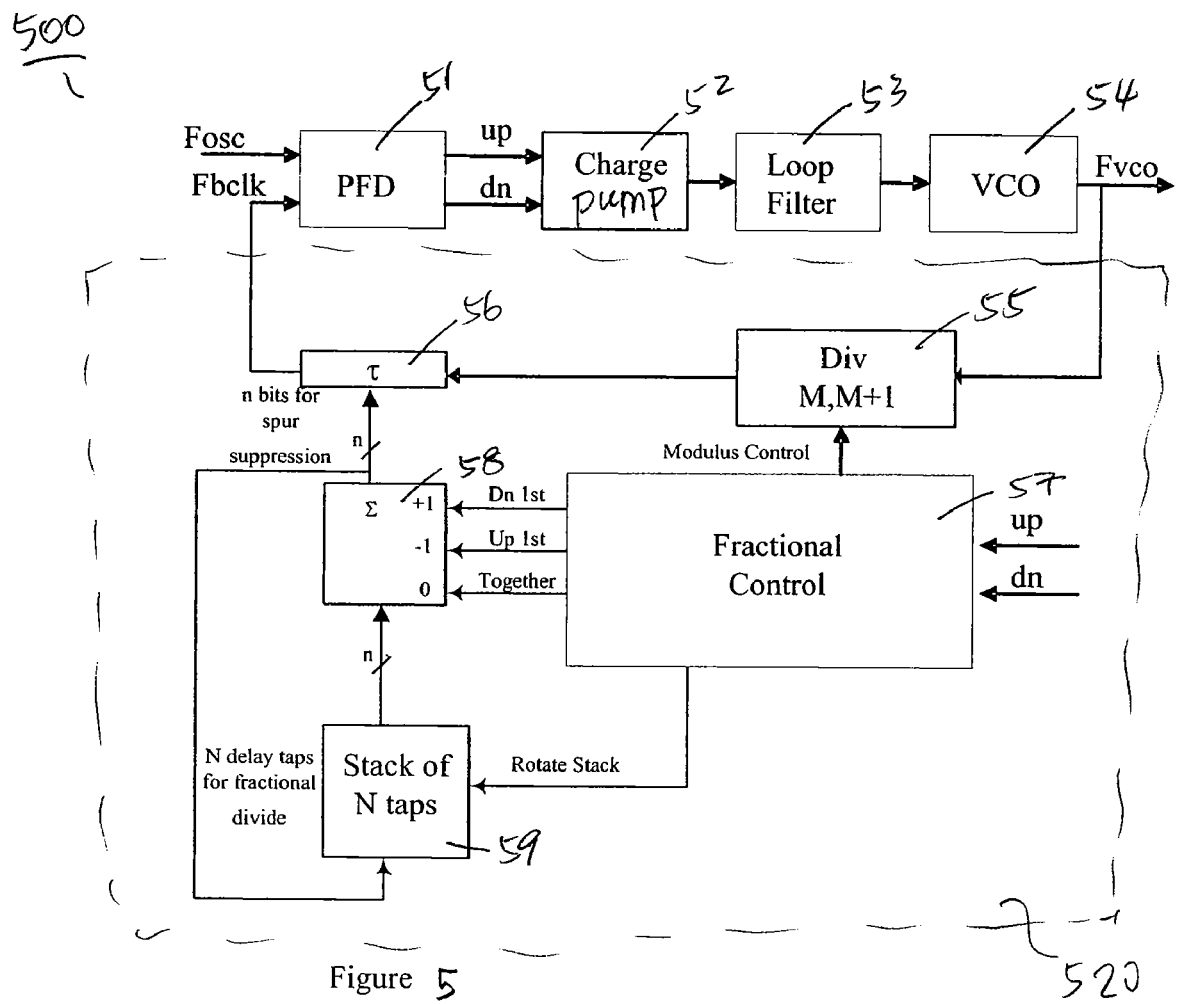
FIG. 5 is a block diagram of an exemplary PLL circuit according to this disclosure.

FIG. 5 shows a block diagram of an exemplary PLL 500 according to this disclosure. In FIG. 5, a phase-frequency comparator (PFD) 51 receives a reference signal Fosc and a feedback signal Fbclk generated by a feedback loop. The PFD 50 detects a phase error between the reference signal Fosc and the feedback signal Fbclk, and outputs pulse signals UP and DN corresponding to the phase error. A charge pump 52 generates a charge pump output current in response to the pulse signals UP and DN, and sends the charge pump output current to a loop filter 53. The loop filter 50 removes a high frequency constituent of the charge pump output current, and outputs a control signal in proportion to the charge pump output current. A voltage controlled oscillator (VCO) 54 generates the output signal Fout in proportion to the control signal of the loop filter 53.

A feedback circuit 520 is provided to generate the feedback signal Fbclk based on the output signal Fvco. The feedback circuit 520 includes a M/M+1 divider 55 that selectively divides the frequency of the output signal Fvco by M or M+1. Implementations of a M/M+1 divider are well-known to people skilled in the art. For example, a M/M+1 divider can be implemented in the form of a counter. The terminal count of the counter is fed to a programmable delay pipeline 56 to generate the feedback signal Fbclk by providing a controlled delay to the terminal count.

The PLL 500 provides an adjustable shift function to time-shift the output of the M/M+1 divider 50, to reduce or eliminate the phase error between the reference signal Fosc and the feedback signal Fbclk. The time-shift performed by the PLL 500 can be delaying the output of the M/M+1 divider 50, omitting one or more segments of the output of the M/M+1 divider 50, advancing the output signal of the M/M+1 divider 50, or a combination thereof.

In one embodiment, in order to adjust a delay amount applied to the output of the M/M+1 divider 55, the feedback circuit 520 includes a fractional control 57, a stack of N taps 59 and a summation circuit 58. The up and down outputs of the PFD 51 serve as indicators to the fractional control 57. According to a sequence of the UP and DN pulses generated by PFD 51, the fractional control 57 indicates whether to increase or decrease the amount of delay applied to the terminal count during each reference cycle. If an up signal is received before a down signal, the summation circuit 58 controls to decrease the delay of the output of the M/M+1 divider 55 associated with that reference cycle by a preset amount. On the other hand, if a down signal is received before an up signal, the summation circuit 58 increases a delay amount associated with that reference cycle by a preset amount. If up and down occur at the same time, then the delay is left unchanged.

Figure 6:
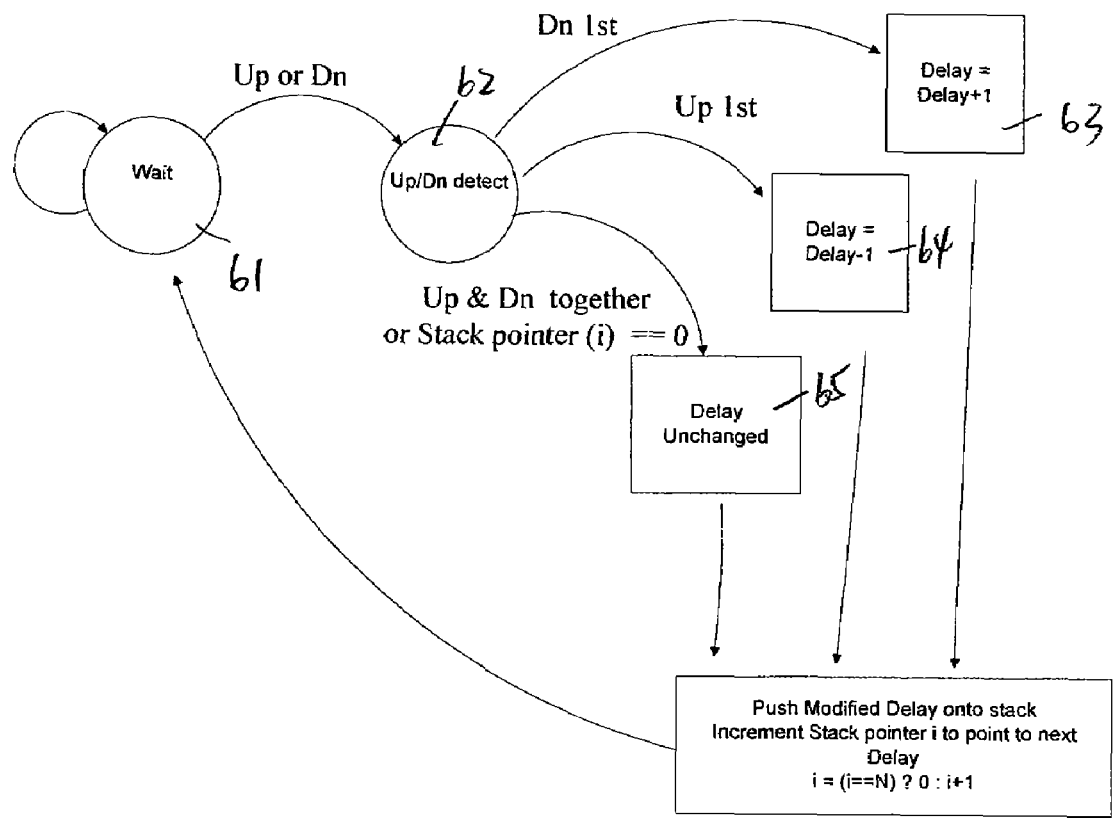
FIG. 6 is a state diagram showing the operation of adaptive time-shift control.
Figure 7:
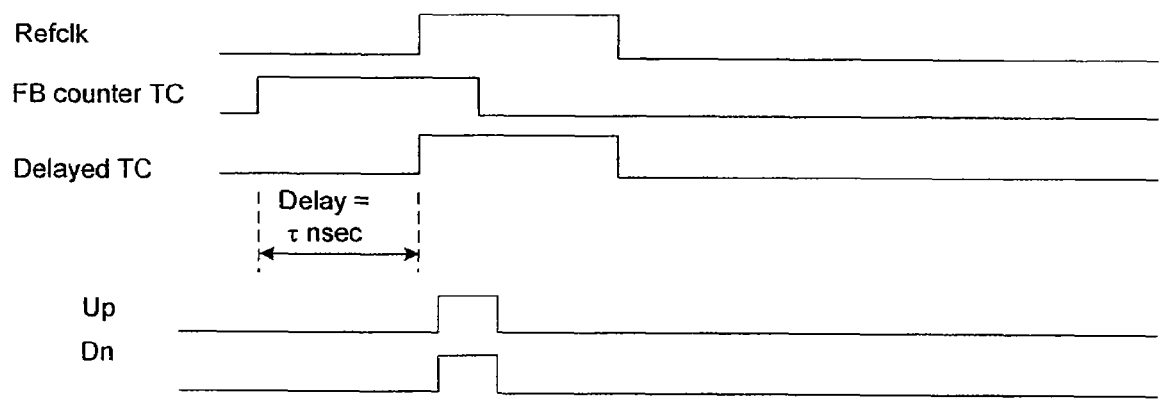
FIG. 7 is a timing chart illustrating the final settled delay according to an exemplary PLL of this disclosure.

FIG. 6 is a flow diagram illustrating the process for determining a proper adjustment to the delay amount. State 61 indicates a state at which no Up or Dn signal arrives. State 62 represents an event that a Up or Dn signal is detected. If the Up signal occurs subsequent to the Dn signal, in State 63, the summation circuit 58 controls to increase the delay by setting the delay=delay+1. On the other hand, if the Up signal occurs prior to the Dn signal, in State 64, the summation circuit 58 controls to decrease the amount of delay by setting Delay=Delay−1. If the Up signal and the Dn signal occur at the same time, then the summation circuit leaves the delay amount unchanged (State 65). In State 66, the summation circuit 58 controls to push the modified or adjusted delay onto stack and increment stack pointer I to point to next delay.

As the number of reference cycles increases, the delay of the output signal of the M/M+1 divider 55 settles at a required amount to minimize the accumulated phase error between the reference signal Fosc and the feedback signal Fbclk.

Figure 9:
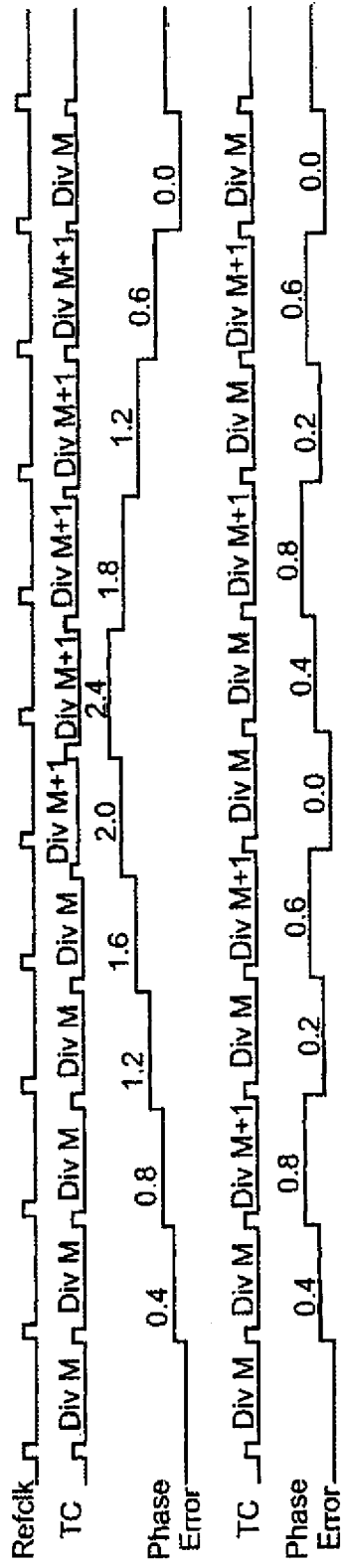
Figure 10:
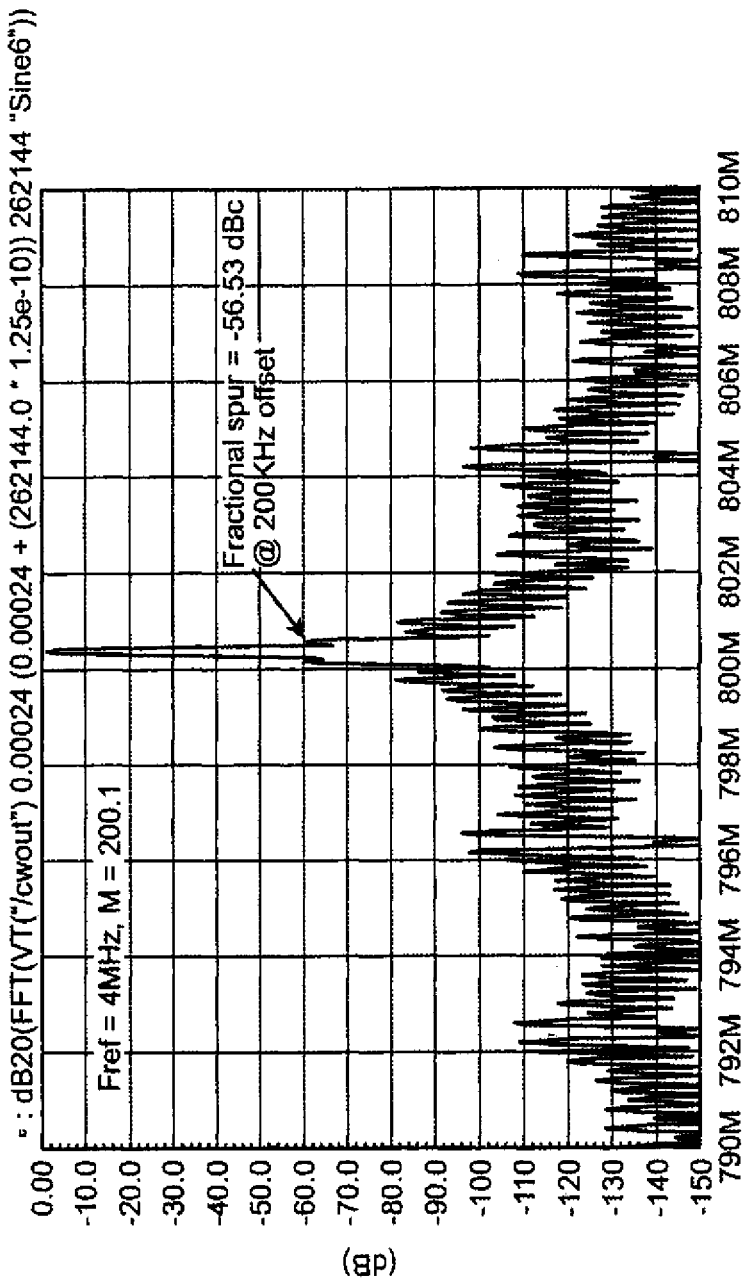

An exemplary settled delay for one of the taps is shown in the time diagram in FIG. 9. There are numerous available solutions to adjust the output of the M/M+1 divider 55 to reduce or eliminate the phase error. By pinning or fixing the first delay to a reference value allows the controlled delay to settle on a unique solution. The first delay slot is chosen as the minimum and fixed so that no action is performed based on the PFD up or down pulses. This reference serves as a do nothing time slot that allows the feedback circuit 520 to converge on a unique solution. The depth of the delay pipeline 56 dictates the fractional resolution of one VCO cycle for uniformly spaced channels. The number of bits used in the delay determines the amount of spur suppression achievable.

Figure 8:
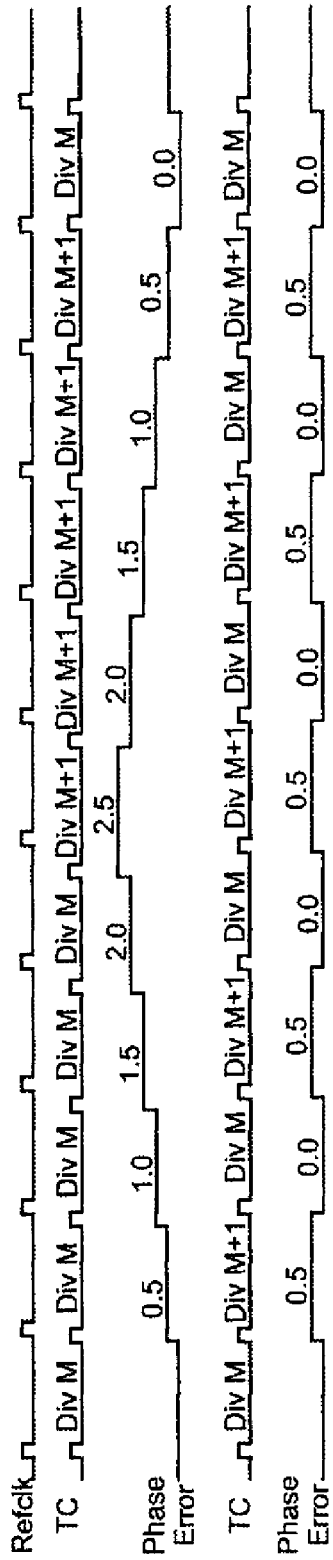
FIGS. 8 and 9 show the effects of different modulus selections and operations in an exemplary PLL circuit according to this disclosure.

The modulus pattern of the M/M+1 divider 55 is chosen to minimize the maximum accumulated phase error that needs correction. For example the pattern of five divide by M's followed by five divide by M+1's will result in a fractional divide by M.5 but with an accumulated phase error of 5*(M/(M+0.5)). If instead an alternating pattern of divide by M and divide by M+1 is used, the accumulated phase error is a factor of five less. The differences of the phase errors using different modulus patterns are shown in FIG. 8. FIG. 9 illustrates the effects of different modulus patterns. As shown in FIG. 9, although a pattern of six divide by M followed by four divide by M+1 will give the correct average frequency, a better pattern is shown at the bottom of FIG. 9 which results in a factor of 3 less accumulated phase error. By using these minimal patterns, the maximum accumulated phase error that needs correction is one VCO cycle or less. These examples are based on a fractional $10^{th}$ PLL.

The same concept for choosing a minimal pattern can be extended to a fractional mth PLL that multiplies the reference by M.m where the value of m is defined as #cycles at div M+1 divided by total #cycles in the pattern. For each reference cycle that the output signal Fvco of the VCO 54 is divided by M, there is an accumulation of 2Π(0.m) phase error towards one complete cycle. For each reference cycle that the output signal of the VCO 54 is divided by M+1, there is an accumulation of 2Π(0.m−1) phase error towards zero. One only needs to keep a running track of the accumulated phase error as the M/M+1 divider 55 is dividing the output signal Fvco by M. If the next cycle causes the accumulated phase error to exceed 1, then the M/M+1 divider 55 is directed to divide by M+1 to cause the accumulated value to drop back by 1−0.m. This action is comparable to a $1^{st}$ order sigma-delta modulation on a fractional input.

Figure 10:
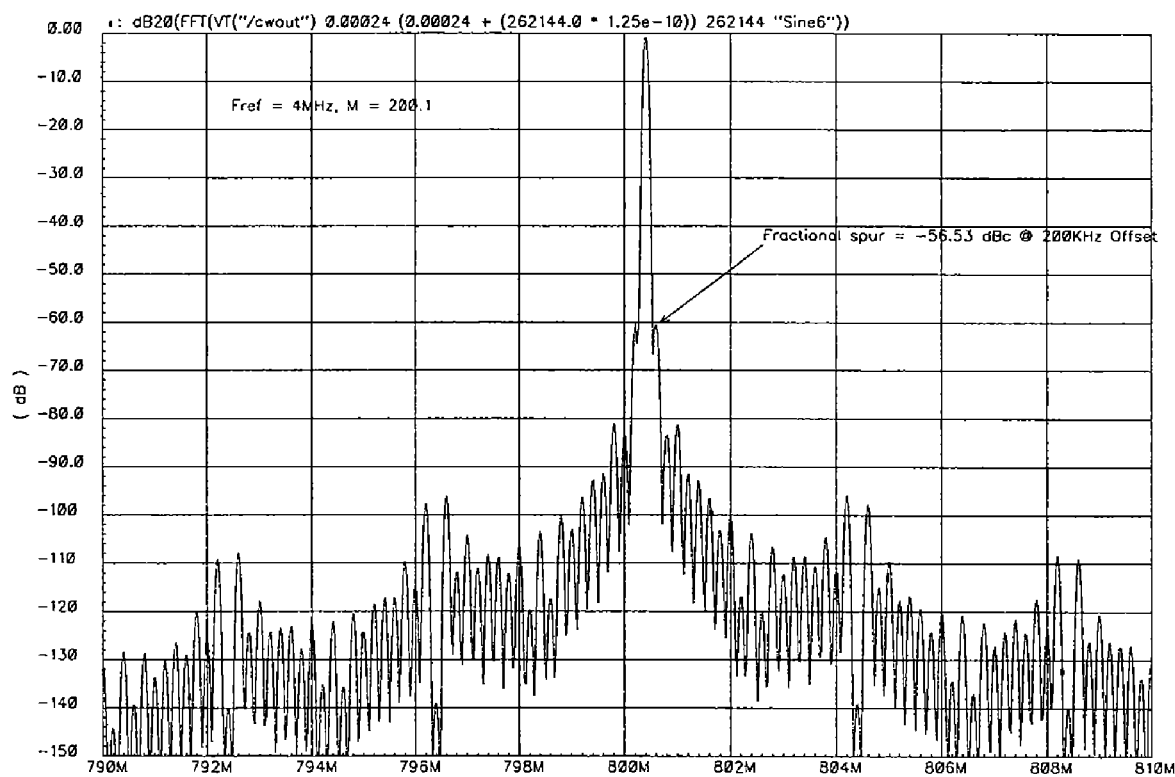
FIG. 10 shows the reduced frequency spurs in an exemplary PLL design according to this disclosure.

Additionally, this accumulated phase error is a representation of the amount of delay to be added to the output of the M/M+1 divider 55 to correct the accumulated phase error. Normally, a digital to analog conversion of the accumulated phase error to an analog delay would require trimming over process corners and calibration to handle temperature and voltage variations. By implementing a feedback circuit 520 that automatically adjusts the amount of delay based on the PFD 51 output, the need for any trim or calibration is eliminated. The implementation only needs enough bits in the DAC to handle the delay resolution required to suppress the fractional frequency spurs. FIG. 10 shows the resulting spur levels using the proposed invention as shown in FIG. 5 to synthesize a multiplication of 200.1 with a 4 MHz reference.

Figure 11:
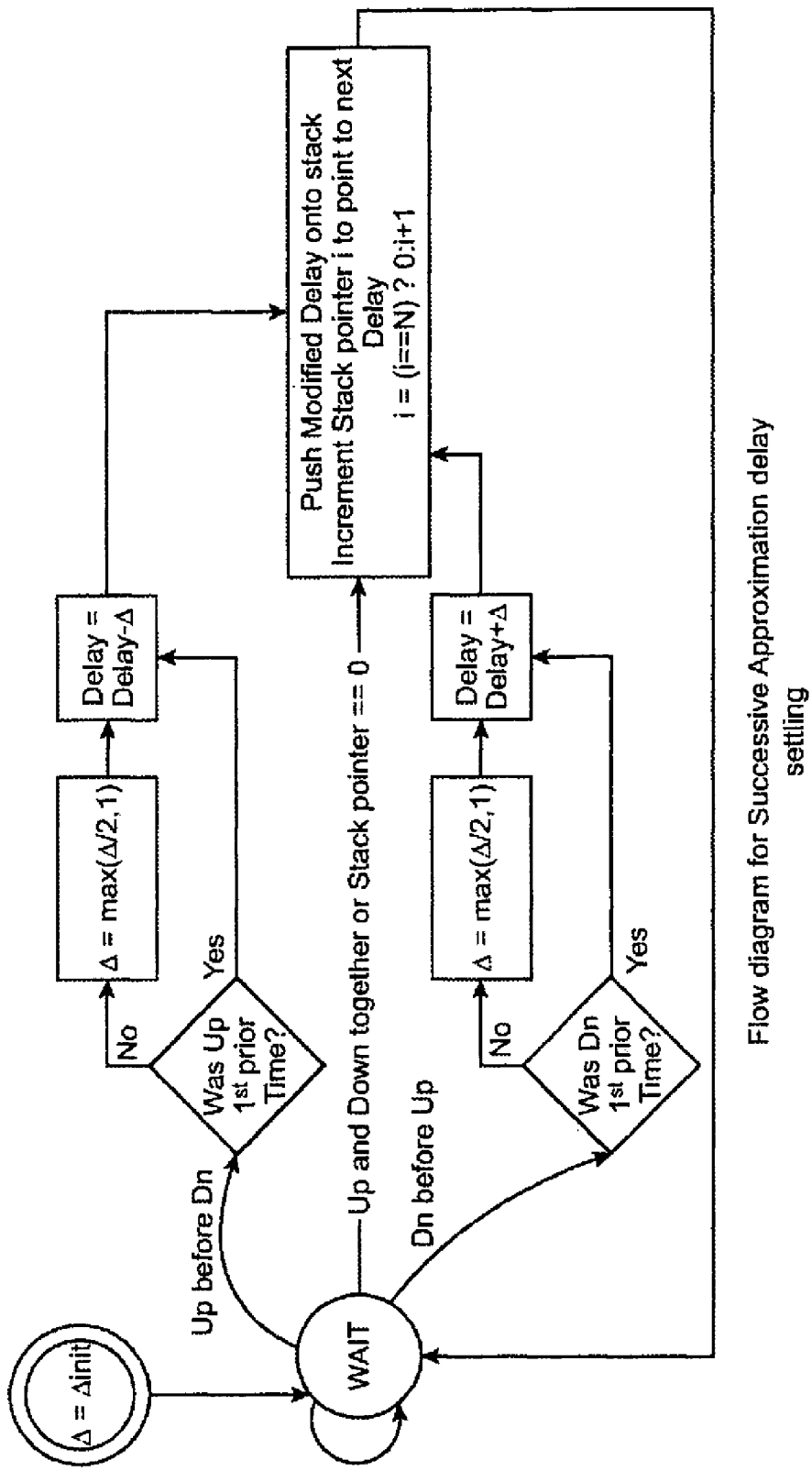
FIGS. 11 and 12 are state diagrams showing the operations of adaptive adjustment in a time-shift amount according to embodiments of this disclosure.

The performance for reducing or eliminating the phase error between the reference signal Fosc and the feedback signal Fbclk can be further improved by using a successive approximation or binary search of the required delay of the output of the M/M+1 divider 55. The flow diagram in FIG. 11 describes an embodiment for successive approximation or binary search of the required delay, in which a delay applied to the output of the M/M+1 divider is adjusted by an increment Δ. As shown in FIG. 11, an initial step size Δ has a relatively large assigned value $\Delta_i$. The delay applied to the output of the M/M+1 divider 55 is repeatedly adjusted by Δ until the first crossover at which the arrival sequence of up and down switches. At this point, Δ is divided by 2 and remains at the new value until the next crossover. This division of Δ by 2 continues at each crossover until the resulting value of Δ=1.

Figure 12:
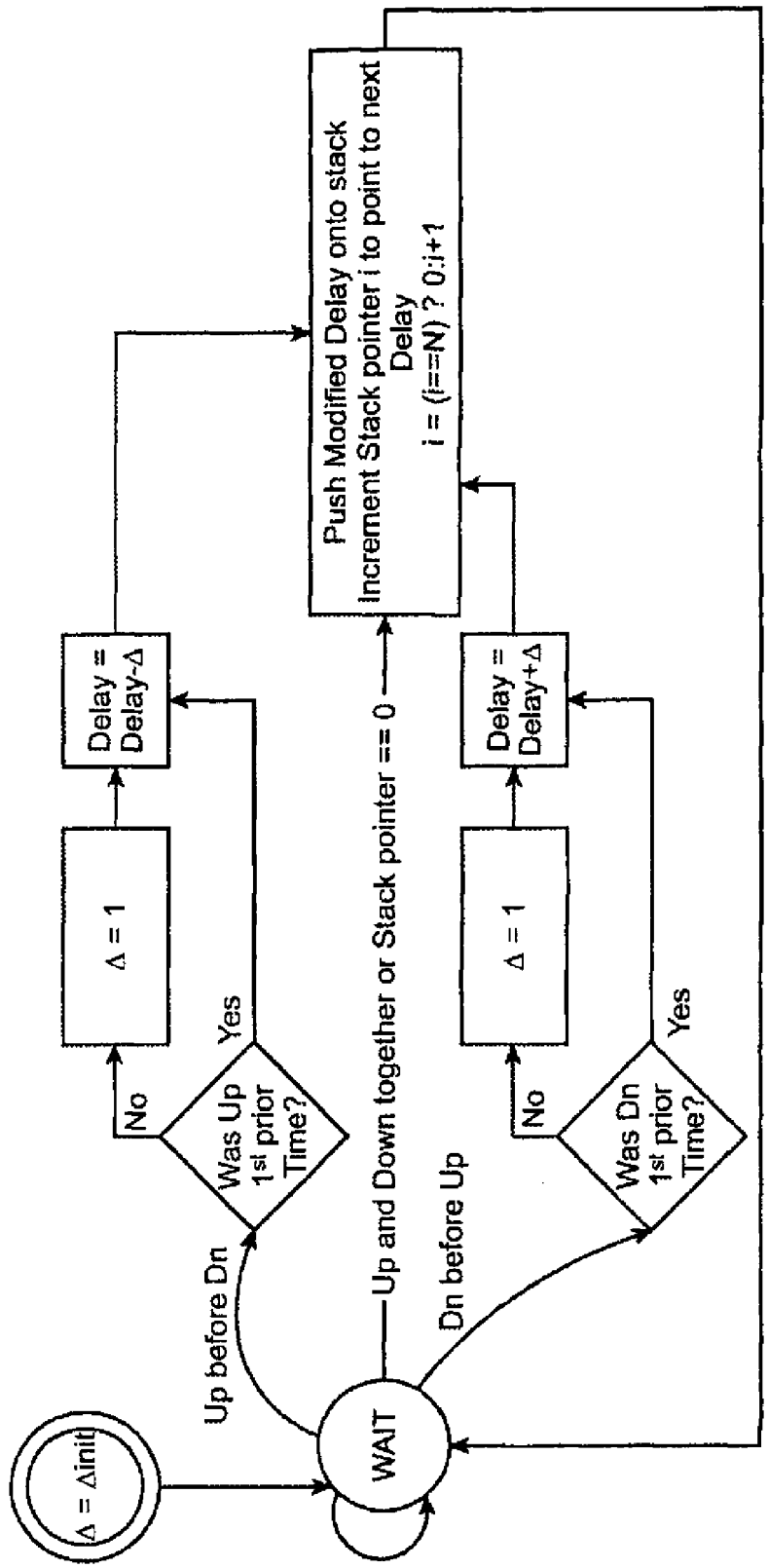
Figure 13:
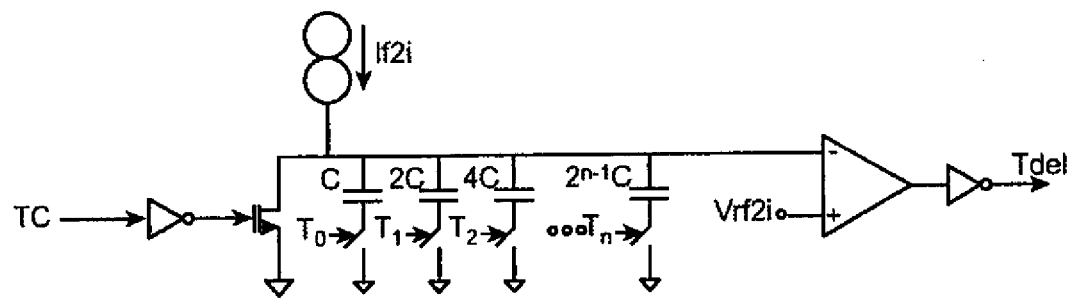
Figure 14:
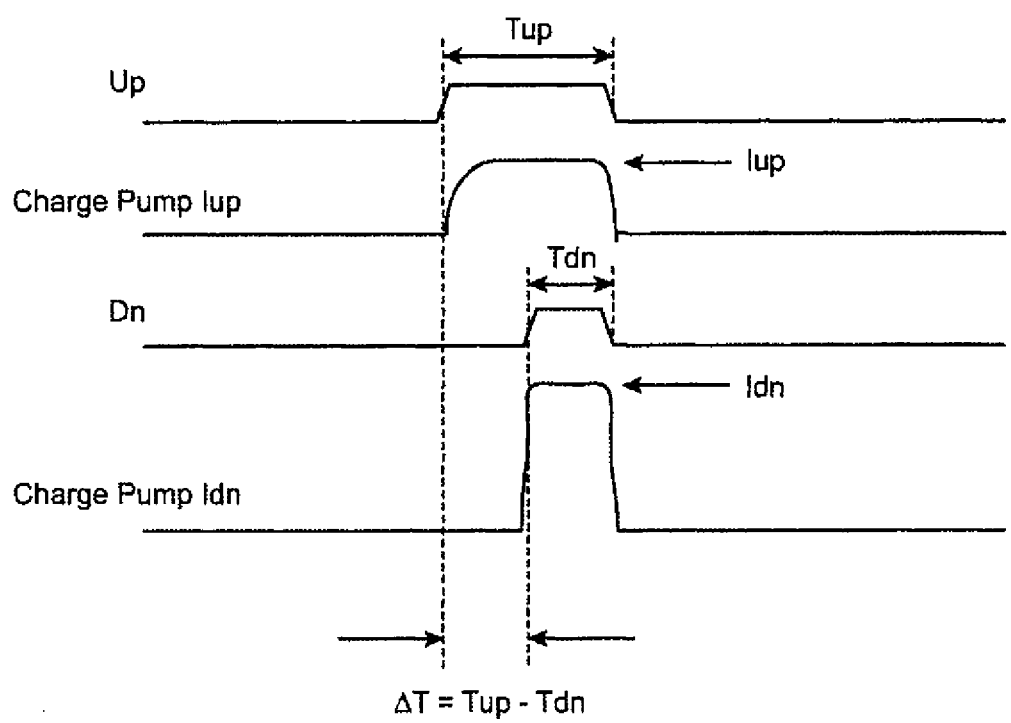
Figure 15:
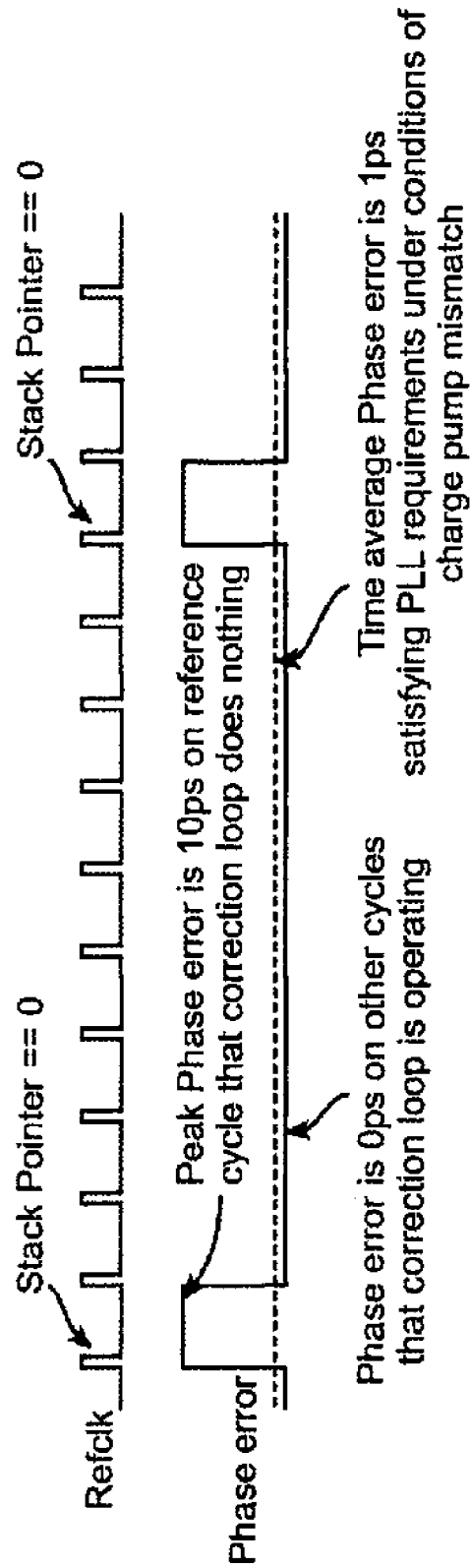
Figure 16:
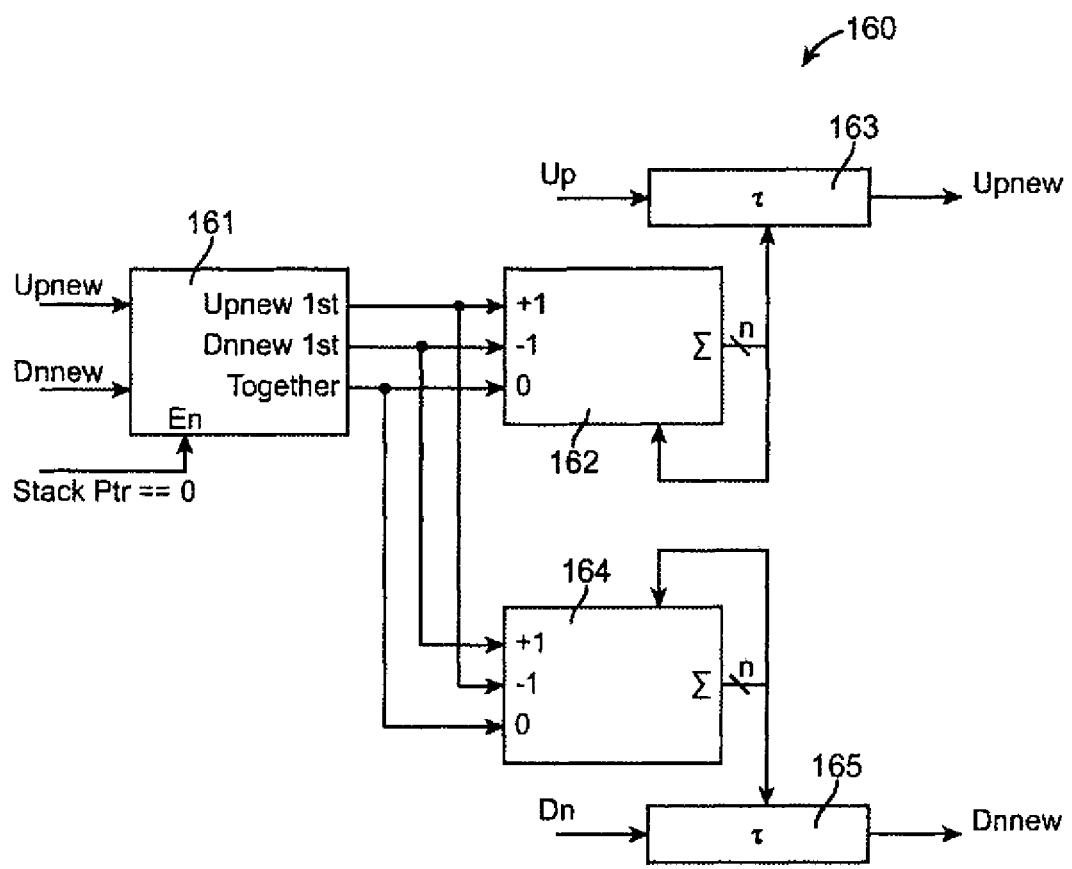

FIG. 12 illustrates another embodiment for speeding the acquisition of the required delay amount to reduce or eliminate phase errors. Additionally large steps followed by small steps at the first turn-around are used. The initial step size Δ is set at a relatively large value $\Delta_i$ until the first crossover of the arrival sequence of the up and down signals. At this point, Δ is set to 1 and the solution is reached by crawling to a steady-state condition.

Figure 13:
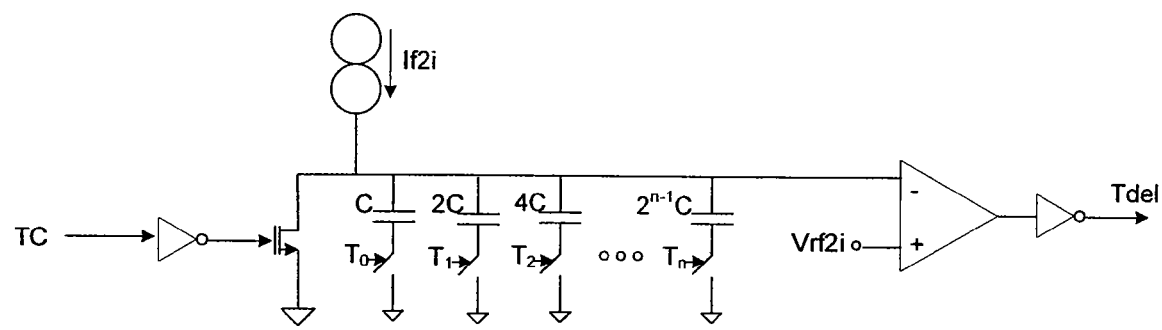
FIG. 13 is a circuit diagram showing an exemplary design of a programmable delay pipeline.

The specific gain or maximum delay for the delay pipeline 56 can be fixed or variable. The fixed maximum delay can be used in applications where the fractional generation requirement is known and the output frequency is limited to a small range, such as 20%. The programmable delay pipeline 56 can be implemented using programmable capacitors. An exemplary embodiment of the programmable delay pipeline 56 is shown in FIG. 13 using programmable capacitors. The number of settings is set by the fractional resolution required. The variable delay element can be used in more general purpose applications where the frequency of application is not known. As shown in FIG. 13, the programmable delay pipeline 56 is constructed with a multiplying input fed by a current reference If2*i*. The current reference If2*i* is supplied by a Frequency to Current (F2I) converter which is fed by the output signal of the VCO 54. Details of a Frequency to Current converter are described in a co-pending U.S. patent application Ser. No. 11/387,564, filed on Mar. 22, 2006 and commonly assigned to the assignee of this application, the entire disclosure of which is incorporated herein by reference. The F2I has a transfer function of $$Iout = Vref * Cf2i * Fvco \qquad 1)$$

Vref is a voltage reference used by an internal comparator. Cf2i is an internal capacitor and Fvco is the frequency of the clock fed into the F2I. The variable delay for a programmable capacitor element is expressed as:

$$Tdly = C*(n/Nmax)*Vref/Iref \quad (2)$$

where C is the programming capacitor and is the same type as used in the F2I. Vref is the same voltage reference used by the F2I and Iref is the current supplied by the F2I. n is the programmable value and Nmax is the maximum programmable value allowed by design. When the two equations are combined, the resulting programmable delay is:

$$Tdly = C*(n/Nmax)/Cf2i*Tvco \quad (3)$$

Tvco is the period of one VCO cycle.

Over frequency of operation, the delay becomes a fixed proportion of the VCO period erring only due to capacitor matching which is a tightly controlled process variation of on the order of 2%. Similarly, the programmable delay can be affected by programming the voltage to compare, or programming the current to charge the capacitor. In the case of programming the current, the programmed value has to follow an inverse mapping because of the inverse relationship current has with time in charging a capacitor.

Figure 14:
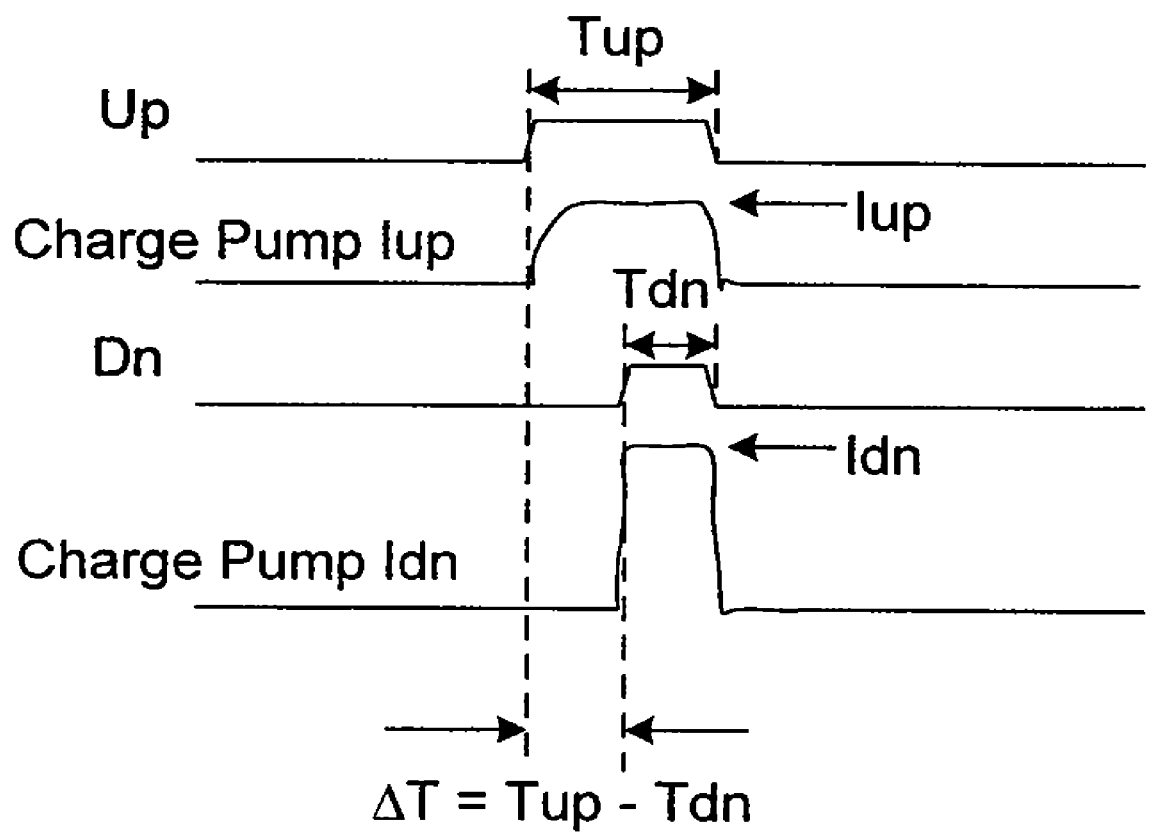
FIGS. 14 and 15 show a current mismatch in outputs of a charge pump and a time offset caused by the mismatch.
Figure 15:
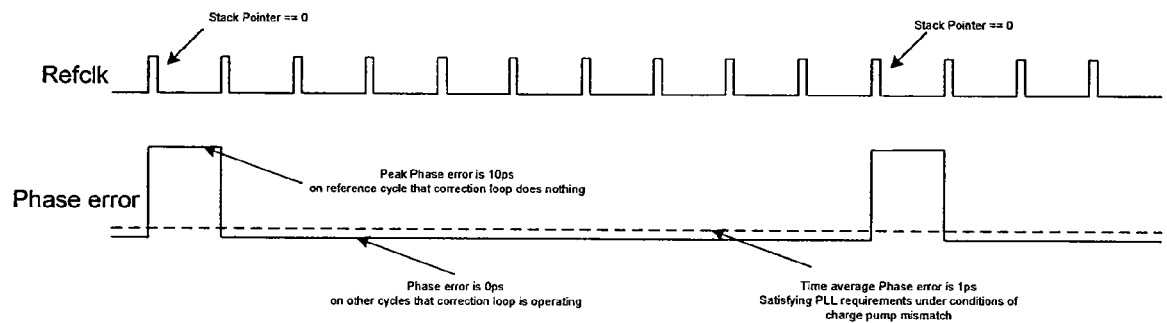

Since the output of the PFD 51 are used to indicate whether to increase or decrease a delay amount applying to the output of the M/M+1 divider 55, mismatches of components in the PLL 500 may cause undesirable offsets. For instance, a charge pump mismatch in the up and down currents will affect the performance of the PLL 500. In this case, the PFD 51 normally compensates for the mismatch by settling on an offset delay between up and down pulses caused by the mismatch, as shown in FIG. 14. Assuming a mismatch within the charge pump 52 results in a 1 ps (picosecond) offset correction between the up signal and the dn signal, the feedback circuit 520 uses the first reference cycle as a pinned reference and performs no operation on the TC and resumes operation on the following 9 reference cycles. The resulting delay errors are shown in FIG. 15. On the cycles that the feedback circuit 520 operates, the phase error is reduced to zero; and on the one cycle that the feedback circuit 520 does nothing, the phase error is 10 ps. This operation results in a 1 ps average cyclical phase error. While this time average phase error does not appear to cause any problem in the PLL 50, the transient error of 10 ps in one cycle results in a very large spur at $1/10^{th}$ the reference frequency.

Figure 16:
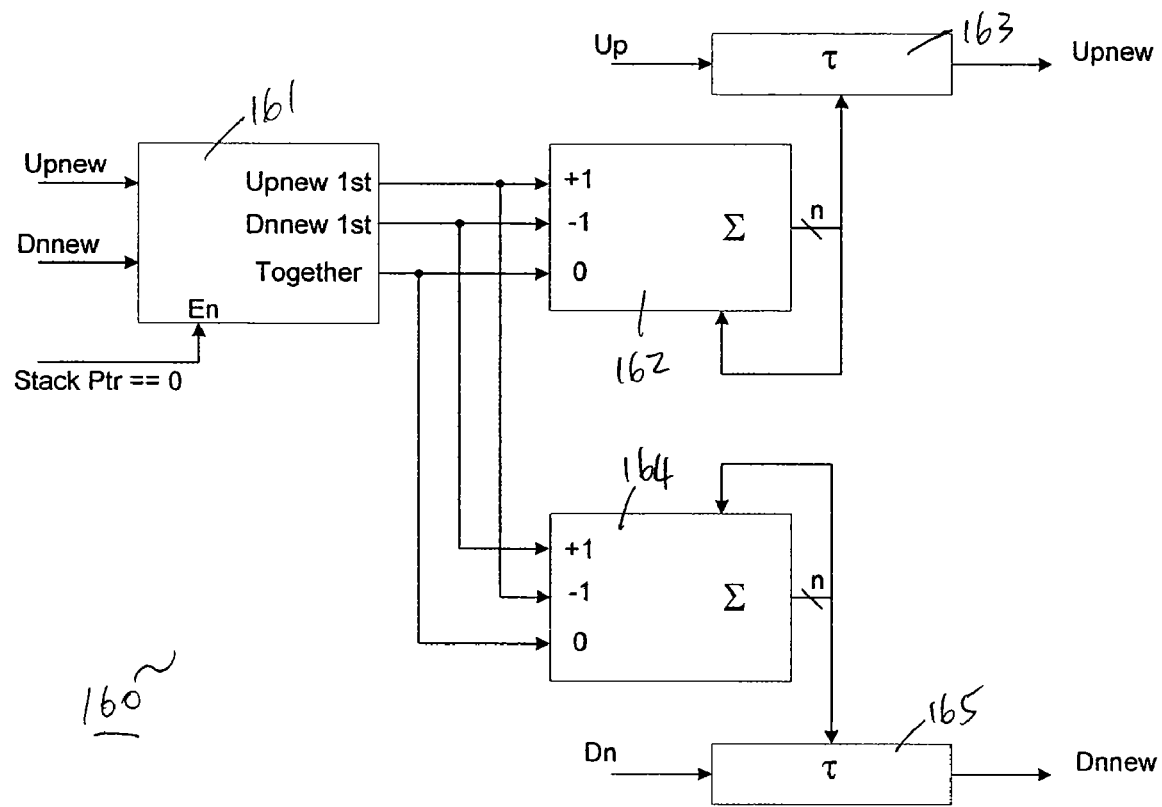
FIG. 16 is a circuit diagram of an exemplary mismatch compensation circuit.
Figure 1:
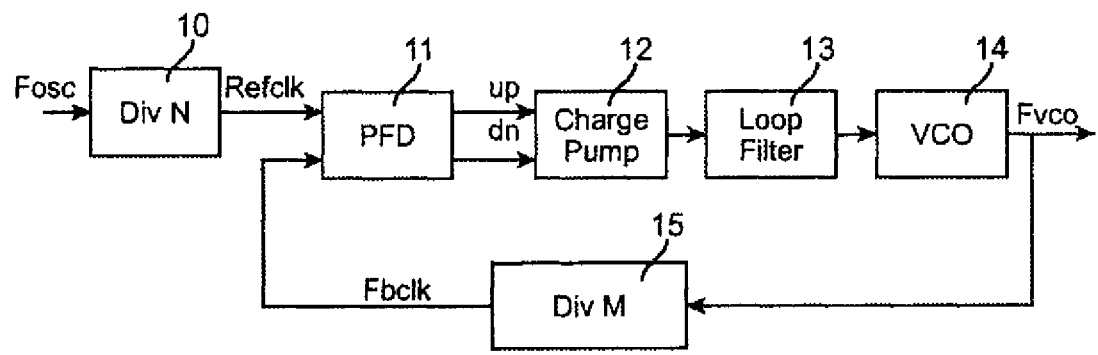
Figure 2:
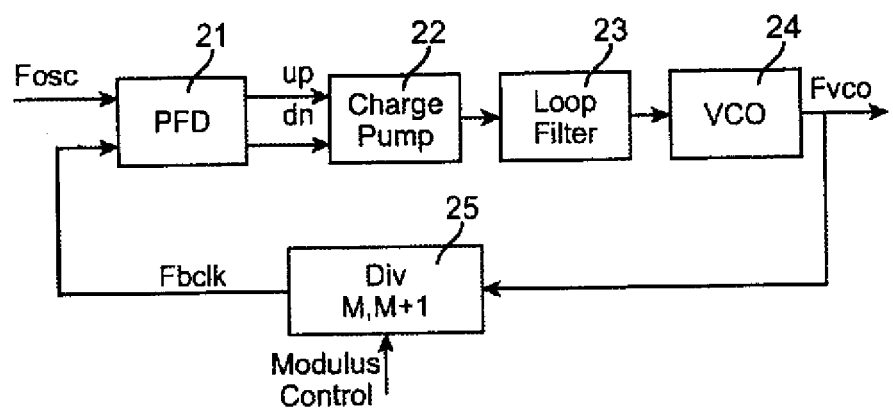
Figure 3:
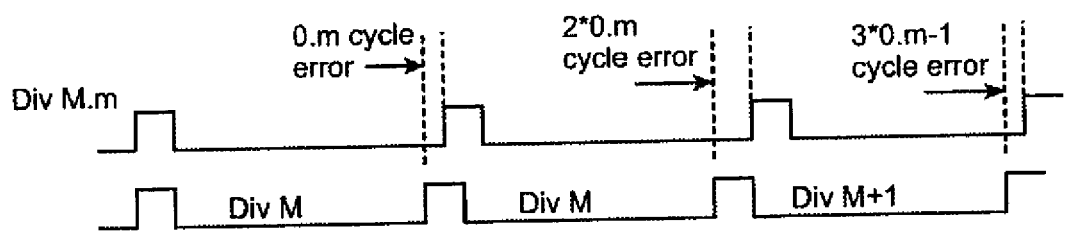
Figure 4:
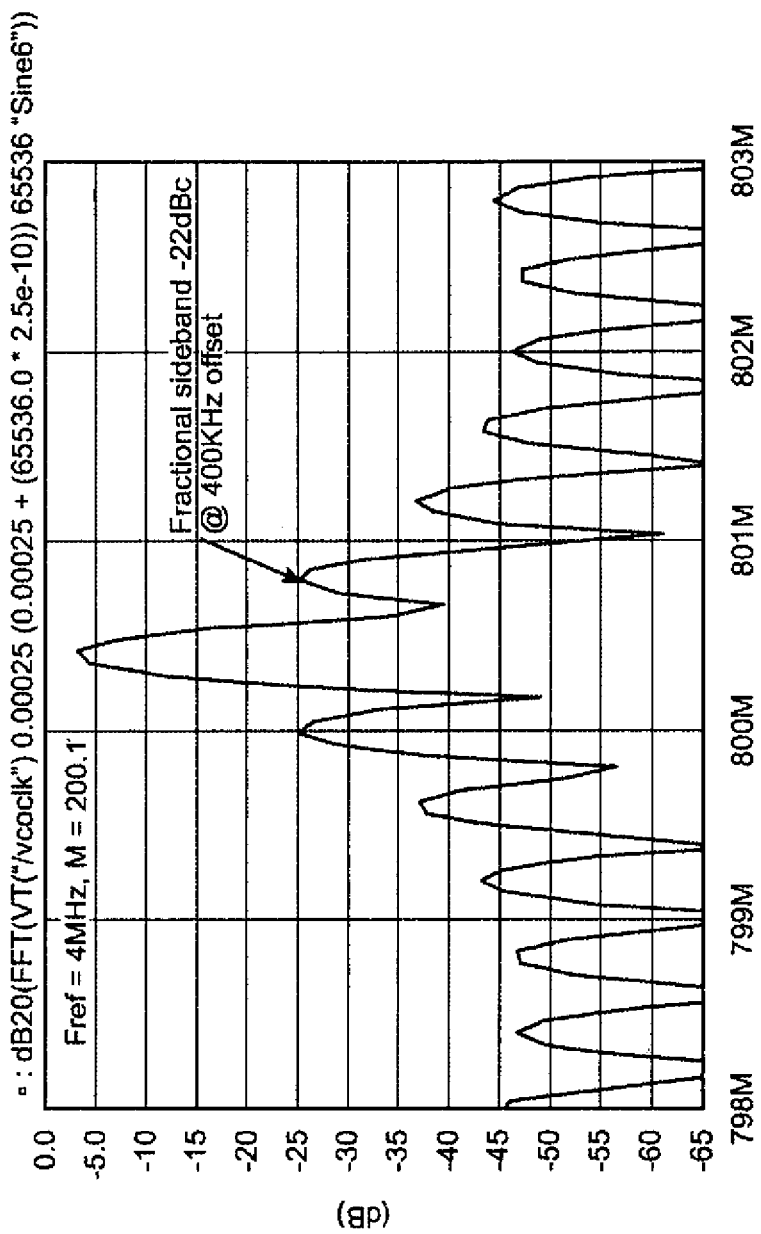
Figure 5:
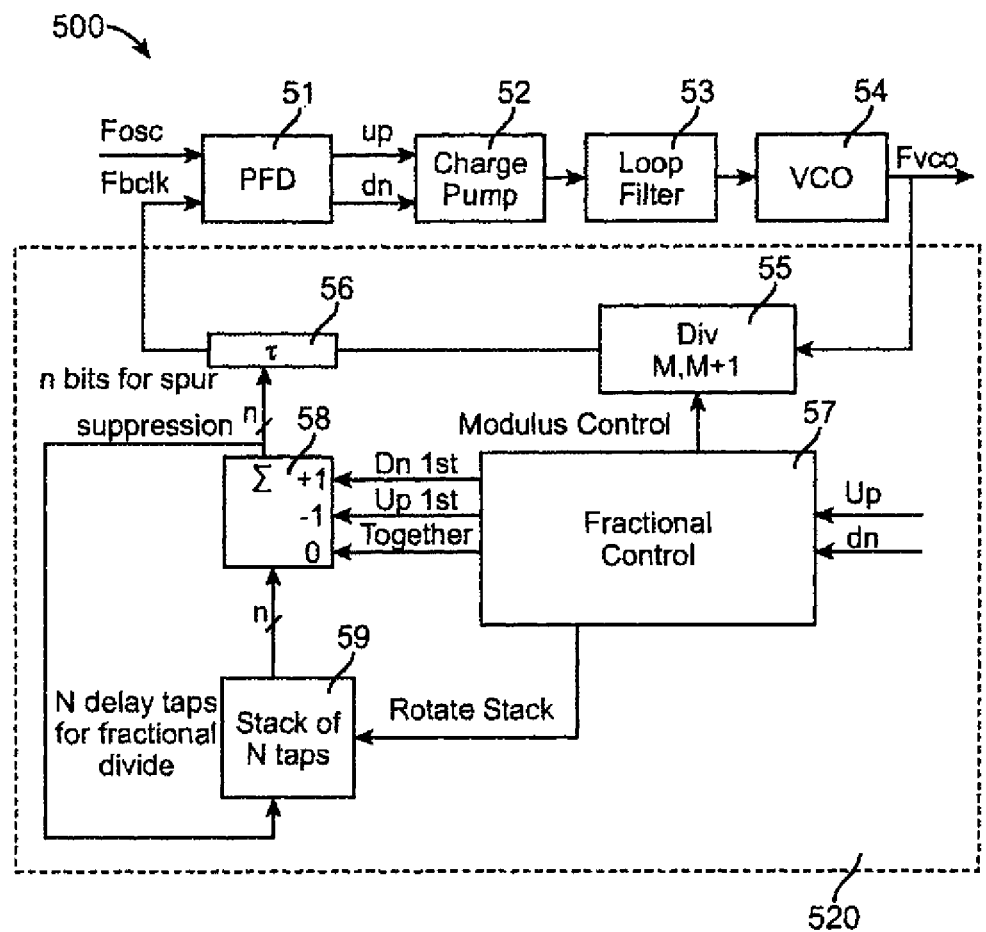
Figure 6:
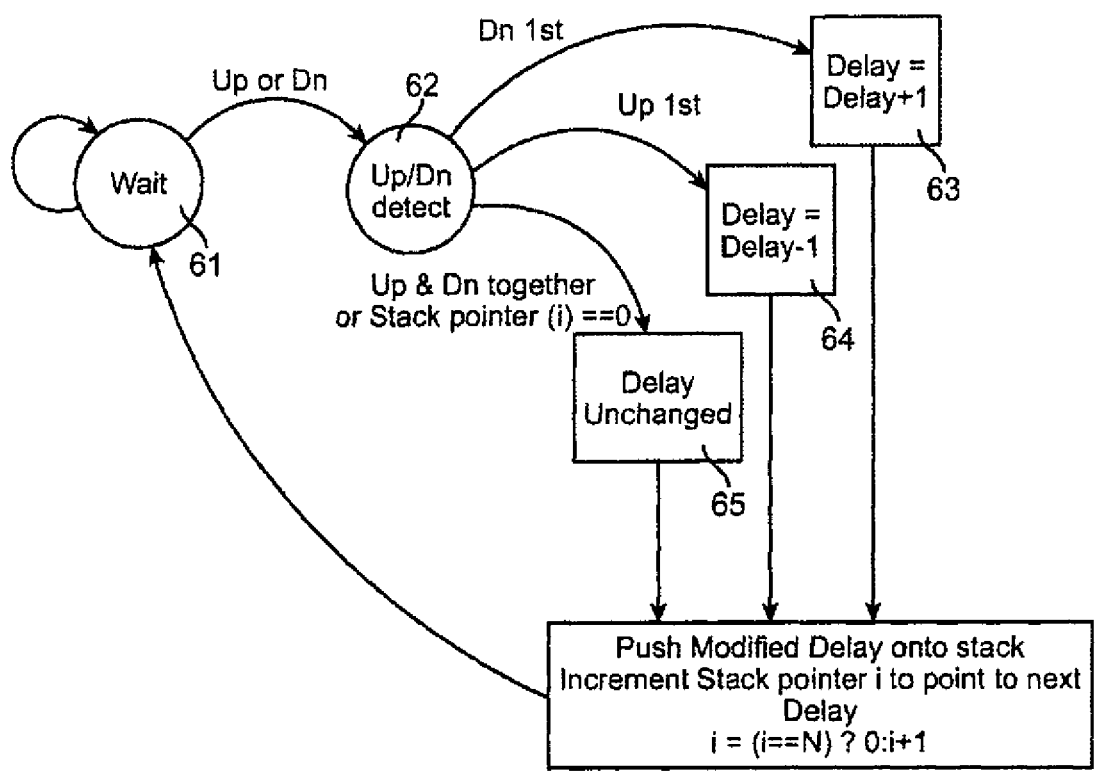
Figure 7:
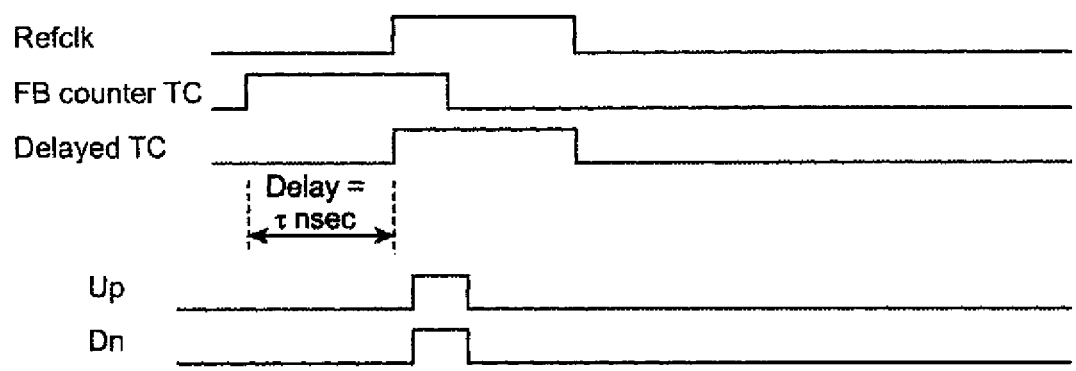

In order to compensate for the large spur caused by components mismatch, an exemplary PLL according to this disclosure utilizes a unique mismatch compensation circuit 160 to eliminate or reduce the phase error introduced by the charge pump mismatch. An exemplary mismatch compensation circuit 160 is shown in FIG. 16.

In circuit 160, the up and down signals out of the PFD 51 are fed into two additional programmable delay elements 163 and 165 to create a mismatch compensated up and down pulses Upnew and Dnnew, which are then fed to fractional control 57 in the feedback circuit 520 as the up and dn signals. The Upnew and Dnnew signals also are fed to a sequence determination circuit 161 that determines an arrival sequence of two input signals. The output of the circuit 161 is sent to two summation circuits 162, 164. The loop bandwidth of the mismatch compensation circuit 160 is much smaller than the loop bandwidth of the PLL 500 thereby allowing the settled behavior of the mismatch compensation to serve as a reference to create modified up and down pulses. These modified pulses are then isolated from the condition of charge pump mismatch. The maximum delay of the delay elements used in the mismatch compensation circuit 160 should be fixed as opposed to be variable because they are used to compensate for a percentage of current mismatch, and the delay caused by the mismatch is generally independent and much smaller than a VCO period.

In order to prevent confusion between the operations of the mismatch compensation circuit 160 and the feedback circuit 520, these two circuits operate independently. The feedback circuit 520 has a pinning or reference time slot that it does nothing, and this time slot is the slot that the mismatch compensation circuit 160 operates. This reference slot is chosen as a single slot that the mismatch compensation circuit 160 performs an operation of either delaying or advancing the up down pulses. All other times the feedback circuit 520 operates but the mismatch compensation circuit 160 does nothing.

The operation of the mismatch compensation circuit is performed in a differential manner. When Upnew signal arrives before the Dnnew signal during the reference slot, the mismatch compensation circuit 160 increases the delay to the modified the Upnew signal and decreases the delay to the modified Dnnew signal. On the other hand, when the Dnnew signal arrives before the Upnew signal during the reference slot, the mismatch compensation circuit 160 decreases the delay to the modified Upnew signal and increases the delay to the modified Dnnew signal. The resulting spurs will then be the same as those achieved by an integer-N PLL with charge pump mismatch.

The disclosure has been described with reference to specific embodiments thereof. It will, however, be evident that various modifications and changes may be made thereto without departing from the broader spirit and scope of the disclosure. The concepts described in the disclosure can apply to various operations of the networked presentation system without departing from the concepts. The specification and drawings are, accordingly, to be regarded in an illustrative rather than a restrictive sense.

What is claimed is:

1. For use with a phase lock loop (PLL) circuit that includes an oscillator that provides an oscillator output signal having a frequency responsive to a control signal; a phase-frequency detector (PFD) that receives a reference signal and a feedback signal and that provides pulse signals up and down indicative of phase error between the reference signal and the feedback signal; a charge pump responsive to the pulses that provides an output current responsive to the pulses; a loop filter that removes a high frequency constituent of the charge pump output and that provides the control signal in response to the charge pump output current; and a multi-modulus divider circuit that receives a signal having the oscillator output signal frequency and that provides the feedback signal having a time-averaged fractional division of the frequency of the oscillator output signal, a method to further reduce phase error between the reference signal and the feedback signal comprising:

using the multi-modulus divider circuit to divide the feedback signal according to a multi-modulus pattern of divides;

during each of multiple respective divides in the pattern, determining an order of up and down pulses provided by the PFD in response to a terminal count produced by the multi-modulus divider during such divides;

during each of multiple respective divides in the pattern, determining a respective indication of a respective delay amount associated with the respective divide in the pattern;

wherein determining the respective indication of the delay amount includes, if the PFD provides the up and down pulses in a first order in response to the terminal count produced by the multi-modulus divider circuit, then changing a respective previously stored indication of a delay amount associated with the respective divide in the pattern so as to increase the respective delay amount; and wherein determining the respective indication of the delay amount further includes, if the PFD provides the up and down pulses in a second order in response to the terminal count produced by the multi-modulus divider circuit, then changing a respective previously stored indication of a delay amount associated with the respective divide in the pattern so as to decrease the respective delay amount;

if determining the respective indication of the delay amount results in changing the respective previously stored indication, then storing the changed indication in place of the previously stored indication;

delaying delivery to the PFD of a terminal count produced by the multi-modulus divider circuit during the respective divide in the pattern based on the respective determined delay amount indication associated with that respective divide.

2. The method of claim 1, wherein the PFD providing the up and down pulses in the first order includes the PFD providing an up pulse prior to providing a down pulse; and wherein the PFD providing the up and down pulses in the second order includes the PFD providing a down pulse prior to providing an up pulse.

3. The method of claim 1 further including:

leaving unchanged the respective previously stored indication associated with that respective divide in the pattern if the PFD provides the up and down pulses in a third order in response to the terminal count produced by the multi-modulus divider circuit.

4. The method of claim 3, wherein the PFD providing the up and down pulses in the first order includes the PFD providing an up pulse prior to providing a down pulse;

wherein the PFD providing the up and down pulses in the second order includes the PFD providing a down pulse prior to providing an up pulse; and wherein the PFD providing the up and down pulses in the third order includes the PFD providing a down pulse and an up pulse substantially simultaneously.

5. The method of claim 1 further including:

during each occurrence of a given divide in the pattern, delaying delivery to the PFD of a terminal count produced by the multi-modulus divider circuit during that given divide in the pattern by a substantially fixed amount.

6. The method of claim 5, adjusting a delay of the up and down pulses provided by the PFD so as to compensate for the mismatch in the PLL; and using the adjusted up and down pulses provided by the PFD with the delay adjustment during the other divides in the modulus pattern.

7. The method of claim 6, wherein adjusting a delay of the up and down pulses is performed during occurrences of the given divide in the pattern.

8. The method of claim 1 further including:

designating an initial step size of changes in delay amount to be used during the acts of changing; and decreasing the step size associated with at least one divide in the pattern in response to a crossover from one occurrence of the pattern to the next, in the order of the up and down pulses provided by the PFD in response to the terminal count produced by the multi-modulus divider during such at least one divide.

9. The method of claim 8, wherein decreasing the step size includes successively decreasing the step size associated with at least one divide in the pattern in response to successive crossovers from one occurrence of the pattern to the next, in the order of the up and down pulses provided by the PFD in response to the terminal count produced by the multi-modulus divider during such at least one divide.

* * * * *

UNITED STATES PATENT AND TRADEMARK OFFICE
CERTIFICATE OF CORRECTION

PATENT NO.        : 7,579,886 B2
APPLICATION NO.   : 11/608213
DATED             : August 25, 2009
INVENTOR(S)       : Michael M. Hufford et al.

It is certified that error appears in the above-identified patent and that said Letters Patent is hereby corrected as shown below:

Title page, illustrative fig. 5 should be deleted and substitute therefore the attached title page consisting of the attached illustrative fig. 5.

In the Drawings

The drawing sheets 1-16 consisting of Fig(s) 1-16 should be deleted and substitute therefore the attached drawing sheets 1-16 consisting of Fig(s) 1-16.

Signed and Sealed this

Nineteenth Day of January, 2010

David J. Kappos
*Director of the United States Patent and Trademark Office*

(12) United States Patent
Hufford et al.

(10) Patent No.: US 7,579,886 B2
(45) Date of Patent: Aug. 25, 2009

(54) PHASE LOCKED LOOP WITH ADAPTIVE PHASE ERROR COMPENSATION

(75) Inventors: Michael M. Hufford, Catonsville, MD (US); Eric Naviasky, Ellicott, MD (US); Tony Caviglia, Marriottsville, MD (US)

(73) Assignee: Cadence Design Systems, Inc., San Jose, CA (US)

(*) Notice: Subject to any disclaimer, the term of this patent is extended or adjusted under 35 U.S.C. 154(b) by 0 days.

(21) Appl. No.: 11/608,213

(22) Filed: Dec. 7, 2006

(65) Prior Publication Data
US 2008/0136532 A1  Jun. 12, 2008

(51) Int. Cl.
  H03L 7/06  (2006.01)
(52) U.S. Cl. .................... 327/156; 327/147
(58) Field of Classification Search ............ 327/147, 327/156
  See application file for complete search history.

(56) References Cited

U.S. PATENT DOCUMENTS

| | | |
|---|---|---|
| 5,038,120 A | 8/1991 | Wheatley et al. |
| 5,334,952 A * | 8/1994 | Maddy et al. ............ 331/1 A |
| 6,603,360 B2 | 8/2003 | Kim et al. |
| 6,661,294 B2 * | 12/2003 | Terashima et al. ........ 331/17 |
| 7,091,760 B1 | 8/2006 | Chang et al. |
| 7,098,754 B2 | 8/2006 | Humphreys et al. |
| 7,339,861 B2 * | 3/2008 | Minamino et al. ..... 369/47.28 |
| 2003/0062957 A1 * | 4/2003 | Terashima et al. ......... 331/17 |
| 2004/0207475 A1 * | 10/2004 | Minamino et al. ......... 331/16 |

FOREIGN PATENT DOCUMENTS

JP  06-276089  * 9/1994

OTHER PUBLICATIONS

Brennan, Paul V., "Phase-Locked Loops/Principles and Practice", Chapter 8 - 'Digital Loop Techniques and Design Methods', McGraw-Hill, 1996, pp. 119-127.
Best, Roland E., "Phase-Locked Loops/Design, Simulation, and Applications", Chapter 3 - 'The Classical Digital PLL (DPLL)'; McGraw-Hill, 1997, pp. 139-140 and 145-147.
Barrett, Curtis (Editor), Texas Instruments Technical Brief SWRA029 "Fractional/Integer-N PLL Basics", Wireless Communication Business Unit; Aug. 1999, pp. 1-55.

* cited by examiner

*Primary Examiner*—Lincoln Donovan
*Assistant Examiner*—Ryan C Jager
(74) *Attorney, Agent, or Firm*—Duane Morris LLP; Stephen C. Durant

(57) ABSTRACT

An adaptive phase-locked loop (PLL) circuit produces an output signal having a frequency in reference to the frequency of a reference signal. The PLL circuit includes an oscillator configured to generate the output signal according to a frequency control signal, and a processing circuit configured to generate a feedback signal deriving from the output signal. An adjustable shift circuit is provided to time-shift the feedback signal. The PLL further includes a phase comparison circuit configured to generate a phase error signal indicating a phase error between the time-shifted feedback signal and the reference signal, and a control circuit configured to generate the frequency control signal based on the phase error signal. The adjustable shift circuit adjusts a time-shift amount to time-shift the feedback signal according to the phase error signal.

9 Claims, 16 Drawing Sheets

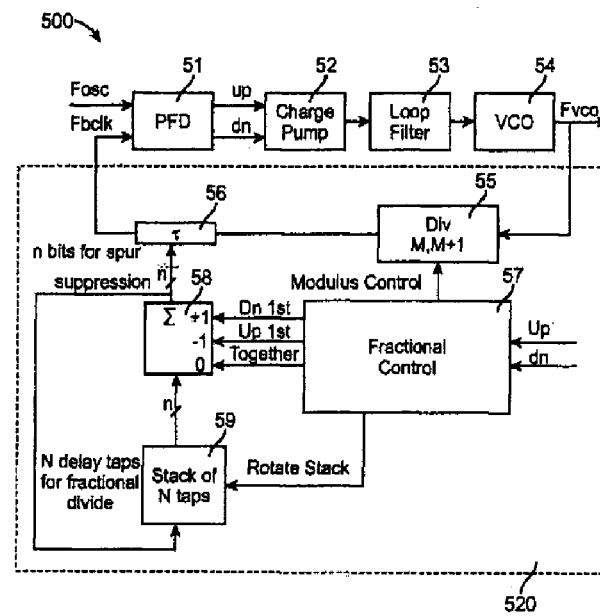

Comparison of phase errors between two modulus patterns for div by M.5. Phase error is normalized to 2pi Comparison of phase errors between two modulus patterns for Div M.4

Flow diagram for Successive Approximation delay settling

Flow diagram for Large step to small step delay settling